United States Patent
Chien et al.

(10) Patent No.: US 8,178,878 B2
(45) Date of Patent: May 15, 2012

(54) MOTHER THIN FILM TRANSISTOR ARRAY SUBSTRATE AND THIN FILM TRANSISTOR ARRAY SUBSTRATE FABRICATED THEREFROM

(75) Inventors: Charles Chien, Miao-Li (TW); Shang-Yu Huang, Miao-Li (TW); Tsau-Hua Hsieh, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 369 days.

(21) Appl. No.: 12/455,823

(22) Filed: Jun. 8, 2009

(65) Prior Publication Data

US 2010/0308331 A1  Dec. 9, 2010

(30) Foreign Application Priority Data

Jun. 6, 2008 (CN) .......................... 2008 1 0067675

(51) Int. Cl.
*H01L 29/04* (2006.01)
(52) U.S. Cl. ............ 257/59; 257/72; 257/620; 257/776; 257/E23.013; 257/E23.143; 257/E23.17

(58) Field of Classification Search .................... 257/59, 257/72, 620, 750, 775, 776, E23.013, E23.143, 257/E23.151, E23.156, E23.169, E23.17
See application file for complete search history.

(56) References Cited

U.S. PATENT DOCUMENTS

| 4,965,646 A * | 10/1990 | Ipri et al. ...................... 257/387 |
| 6,755,724 B2 | 6/2004 | Shin et al. |
| 6,940,142 B2 * | 9/2005 | Street et al. ................... 257/443 |
| 7,372,514 B2 * | 5/2008 | Matsumoto et al. ............ 349/55 |
| 2003/0162317 A1 * | 8/2003 | Tanaka et al. ................... 438/48 |

FOREIGN PATENT DOCUMENTS

CN 1963646 A 5/2007

* cited by examiner

*Primary Examiner* — Matthew E Warren
(74) *Attorney, Agent, or Firm* — Bacon & Thomas, PLLC

(57) ABSTRACT

A mother thin film transistor (TFT) array substrate includes an insulating substrate, at least two TFT arrays and printed wirings. The TFT array includes TFTs formed on the insulating substrate. The printed wirings are connected to the TFT arrays. The printed wiring includes a discontinuous metal layer and at least one bridge layer connecting the discontinuous metal layer. The bridge layer is made from corrosion-resistant material.

13 Claims, 2 Drawing Sheets

MOTHER THIN FILM TRANSISTOR ARRAY SUBSTRATE AND THIN FILM TRANSISTOR ARRAY SUBSTRATE FABRICATED THEREFROM

BACKGROUND

1. Technical Field

The present disclosure relates to thin film transistor (TFT) arrays, and particularly to a mother TFT array substrate including printed wirings with bridge layer of corrosion-resistant material, and TFT array substrates fabricated therefrom.

2. Description of Related Art

Liquid crystal displays are commonly used as display devices for compact electronic apparatuses, because they not only provide good quality images but are also very thin. A liquid crystal display generally includes a liquid crystal panel. The liquid crystal panel generally includes a TFT array substrate, a color filter substrate, and a liquid crystal molecule layer disposed therebetween. In mass production of liquid crystal displays, a plurality of individual TFT array substrates may be obtained by cutting a mother TFT array substrate into separate pieces.

Referring to FIG. 5, a typical mother TFT array substrate is shown. The mother TFT array substrate 1 includes an insulating substrate 11, a plurality of TFT arrays 12, and a plurality of printed wirings 13. The plurality of TFT arrays 12 and the plurality of printed wirings 13 are formed on the insulating substrate 11. Each of the TFT arrays 12 defines a TFT array substrate 10 including a plurality of TFTs 121. The printed wirings 13 are connected between adjacent TFT array substrates 10. The mother TFT array substrate 1 can be divided into a plurality of TFT array substrates 10 along cutting lines A-A. After that, the printed wirings 13 are generally used to connect the TFTs 121 and an integrated driving circuit (not shown).

Referring to FIG. 6, each of the printed wirings 13 includes a metal layer 131 and a protective layer 132. The metal layer 131 is generally of aluminum printed on a surface of the insulating substrate 11. The protective layer 132 is generally of insulating material covering the metal layer 131, such that metal layer 131 is isolated from the environment by the protective layer 132, preventing damage thereto by moisture.

However, when the mother TFT array substrate 1 is cut into a plurality of TFT array substrates 10, each of the printed wirings 13 is broken, exposing a split. Moisture can thus easily erode the metal layer 131 through the split, and the corrosion may spread along the metal layer 131 to affect the TFTs 121.

DETAILED DESCRIPTION

Reference will now be made to the drawings to describe exemplary embodiments of the present disclosure in detail.

Figure 1:
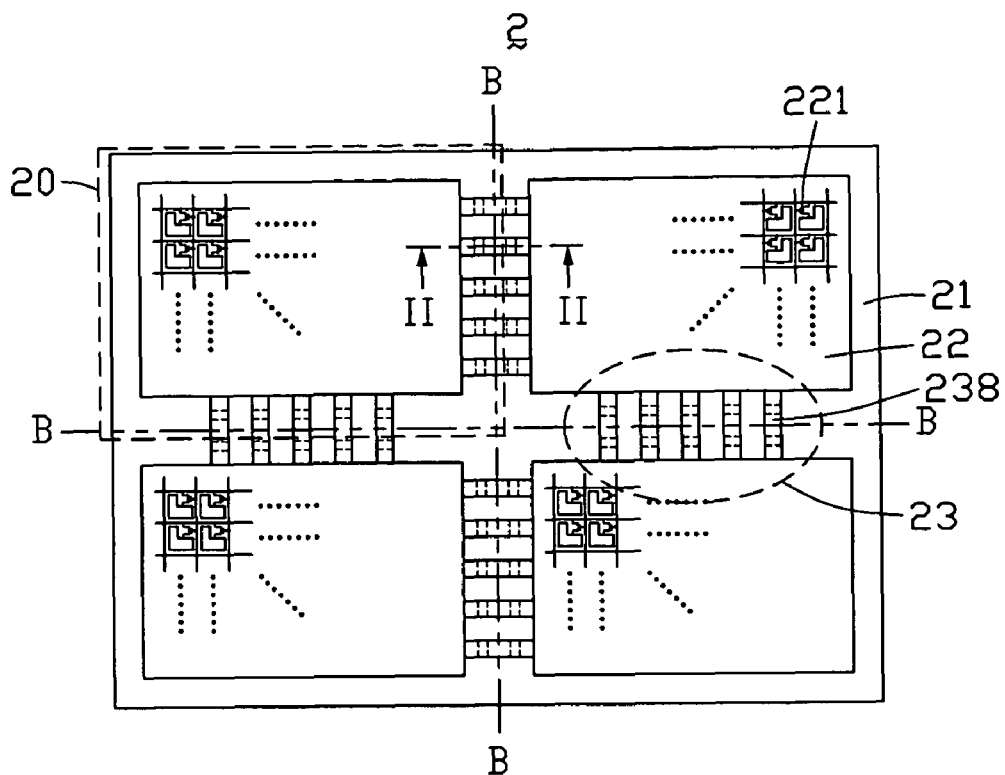
FIG. 1 is a top plan view of a first embodiment of a mother TFT array substrate according to the present disclosure.

Referring to FIG. 1, a first embodiment of a mother TFT array substrate 2 according to the present disclosure is shown. The mother TFT array substrate 2 includes an insulating substrate 21, a plurality of TFT arrays 22, and a plurality of printed wiring regions 23. The insulating substrate 21 is made from transparent insulating material, preferably such as glass. The plurality of TFT arrays 22 and the plurality of printed wiring regions 23 are formed on the insulating substrate 21. Each of the TFT arrays 22 defines a TFT array substrate 20. The adjacent TFT arrays 22 are connected by the printed wiring regions 23.

Each of the TFT arrays 22 includes a plurality of TFTs 221, a plurality of pixel electrodes (not labeled), a plurality of gate lines (not labeled), and a plurality of data lines (not labeled) formed during separate photolithographic mask processes. Each of the TFTs 221 is connected to a gate line and a data line. Each of the pixel electrodes is connected to a TFT 221. Scan voltages are applied via the gate lines to turn on the TFTs 221, and data voltages are applied via the data lines and the TFTs 221 to the pixel electrodes. The pixel electrodes are generally of indium tin oxide (ITO) or indium zinc oxide (IZO). The gate lines and the data lines are generally of aluminum with thickness of 150 nm to 300 nm, or molybdenum with thickness of 50 nm to 200 nm. However, it should be understood by one of ordinary skill in the art that these materials and component parameters may change depending on various embodiments.

Figure 2:
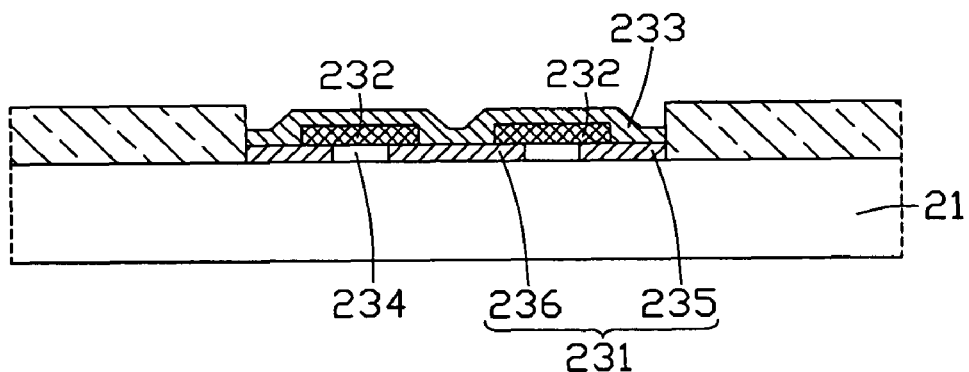
FIG. 2 is an enlarged cross-section of the mother TFT array substrate of FIG. 1, taken along line II-II.

Referring to FIG. 2, a plurality of printed wirings 238 and a protective layer 233 are formed on each of the printed wiring regions 23. The printed wirings 238 are printed directly on a surface of the insulating substrate 21. The protective layer 233 is deposited to cover the printed wirings 238. Each of the printed wirings 238 is located between two adjacent TFT arrays 22.

Each of the printed wirings 238 includes a discontinuous metal layer 231 and two bridge layers 232. As shown in FIG. 2, the metal layer 231 includes two first metal layers 235, a second metal layer 236 and two disconnected portions 234. Each of the first metal layers 235 is directly connected to the TFT arrays 22, and the second metal layer 236 is spaced from the first metal layers 235 by the two disconnected portions 234. Namely, the metal layer 231 is a discontinuous metal layer with openings. The bridge layers 232 are deposited to cover but not fill the two disconnected portions 234, respectively. Therefore the first metal layers 235 and the second metal layer 236 are connected by the bridge layers 232, with an opening remaining between the first metal layer 235 and the second metal layer 236.

The metal layer 231 is made from aluminum or molybdenum, preferably formed during the same photolithographic mask process as the gate lines or the data lines. The bridge layers 232 are made from corrosion-resistant material, such as ITO or IZO. Preferably, the bridge layers 232 and the pixel electrode are formed during the same photolithographic mask process.

When the mother TFT array substrate 2 is cut into a plurality of TFT array substrates 20 along the cutting lines B-B, the second metal layer 236 is divided into two parts. Thus each of the TFT array substrate 20 includes a plurality of second metal layers 236 with a split (not shown) exposed to the environment.

If moisture in the environment etches the second metal layer 236 through the split, because the first metal layer 235 and the second metal layer 236 are connected by the bridge layer 232 of corrosion-resistant material, the corrosion is contained by the bridge layer 232 and cannot spread to the first metal layer 235, and integrity of the TFTs 221 is enhanced. In addition, because the bridge layer 232 can be formed with the pixel electrode during a single photolithographic mask process, there is no increase in the number of photolithographic mask processes.

Figure 3:
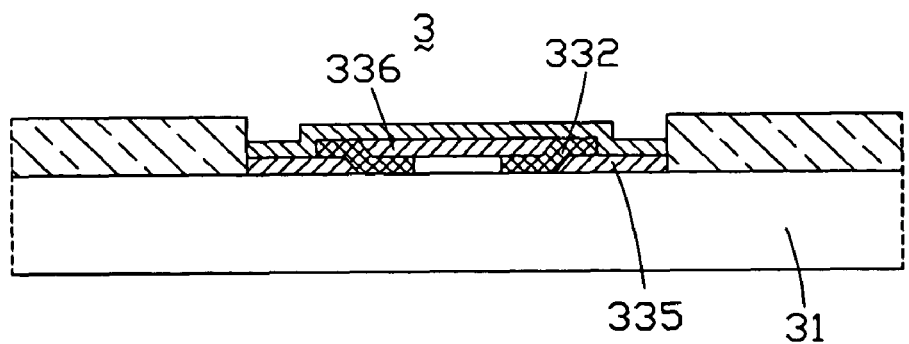
FIG. 3 is a cross-section of a second embodiment of a mother TFT array substrate according to the present disclosure.

FIG. 3 shows a second embodiment of a mother TFT array substrate 3 according to the present disclosure. Two discontinuous first metal layers 335 are printed directly on a surface of an insulating substrate 31 with a disconnected portion (not labeled) located therebetween. The two bridge layers 332 are deposited to cover part of the first metal layer 335 respectively, and the bridge layers 332 fill in the disconnected portion to extend to the insulating substrate 31. A second metal layer 336 is deposited to cover the disconnected portion and connect the two bridge layers 332. Because the bridge layer 332 covers the first metal layer 335 directly, corrosion is also contained by the bridge layer 332.

Figure 4:
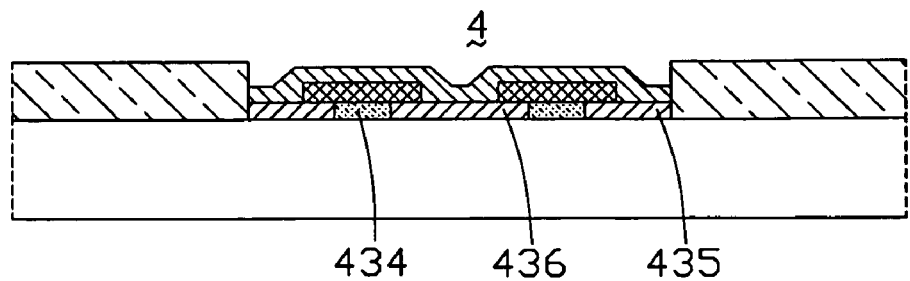
FIG. 4 is a cross-section of a third embodiment of a mother TFT array substrate according to the present disclosure.
Figure 5:
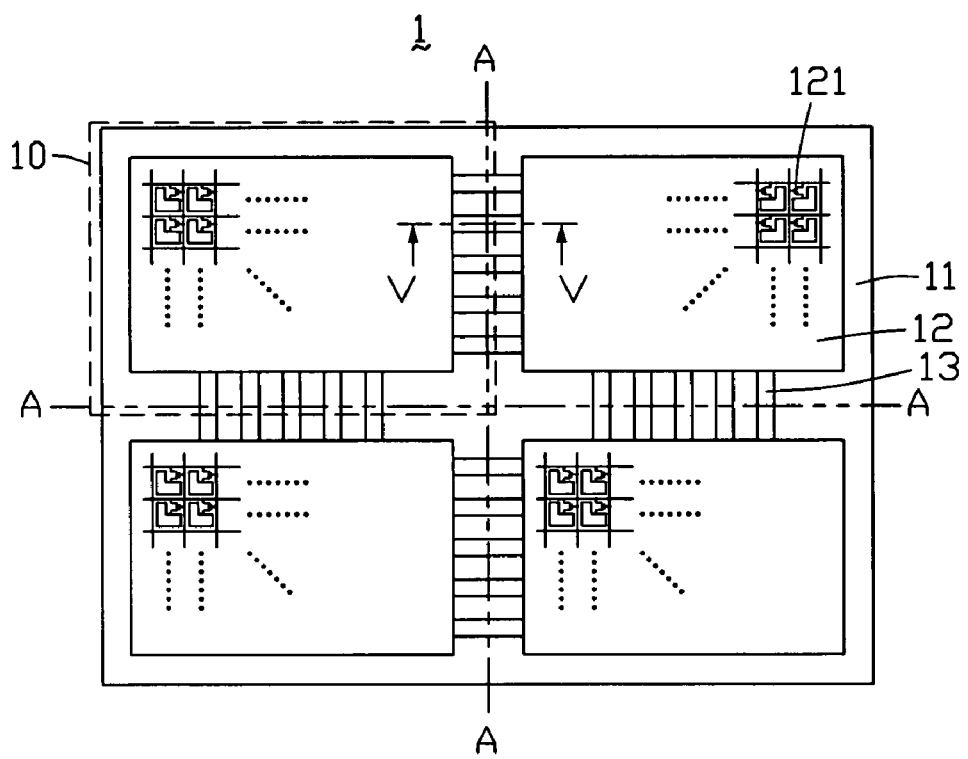
FIG. 5 is a top plan view of a frequently used mother TFT array substrate.
Figure 6:
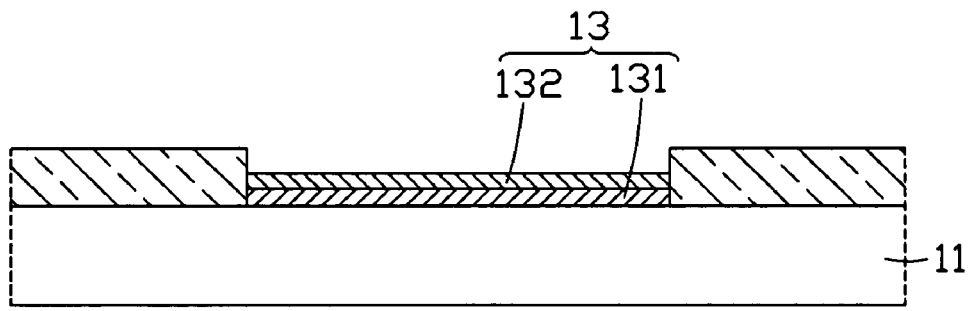
FIG. 6 is an enlarged, cross-section of the mother TFT array substrate of FIG. 5, taken along line V-V.

FIG. 4 shows a third embodiment of a mother TFT array substrate 4 according to the present disclosure. Openings between a first metal layer 435 and a second metal layer 436 can be filled with insulating material layer 434.

Further or alternative embodiments of the present mother TFT array substrate can include, for example, the bridge layer 232 being made from high-melting point metal or alloy, such as chromium, titanium, niobium, vanadium, tungsten, tantalum, zirconium, and hafnium.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mother thin film transistor (TFT) array substrate, comprising:
   an insulating substrate;
   at least two TFT arrays comprising a plurality of TFTs formed on the insulating substrate; and
   a plurality of printed wirings connected to the TFT arrays, wherein at least one of the plurality of printed wirings comprises a discontinuous metal layer and at least one bridge layer connecting the discontinuous metal layer, the bridge layer being made from corrosion-resistant material,
   wherein the discontinuous metal layer comprises a first metal layer partly covered by the bridge layer, a second metal layer partly covering the bridge layer, and a first disconnected portion between the first metal layer and the second metal layer and partly filled with the bridge layer.

2. The mother TFT array substrate of claim 1, wherein the bridge layer is filled in the disconnected portion to electrically connect the discontinuous metal layer.

3. The mother TFT array substrate of claim 1, wherein the discontinuous metal layer further comprises a third metal layer adjacent to the second metal layer and partly covered by the bridge layer, a second disconnected portion between the second layer and the third metal layer and partly filled with the bridge layer, and the second metal layer is located between the first metal layer and the third metal layer.

4. The mother TFT array substrate of claim 3, wherein the first metal layer and the third metal layer are connected to the TFT arrays.

5. The mother TFT array substrate of claim 1, wherein the mother TFT array substrate further comprises a protective layer covering the printed wirings.

6. The mother TFT array substrate of claim 1, wherein the TFT array further comprises a plurality of pixel electrodes formed during the same photolithographic mask process as the bridge layer.

7. The mother TFT array substrate of claim 1, wherein the bridge layer is made from indium tin oxide, indium zinc oxide, high-melting point metal, or alloy.

8. A thin film transistor (TFT) array substrate, comprising:
   an insulating substrate;
   a TFT array comprising a plurality of TFTs formed on the insulating substrate; and
   a plurality of printed wirings connected to the TFTs, wherein at least one of the plurality of printed wirings comprises a discontinuous metal layer and at least one bridge layer connecting the discontinuous metal layer, the bridge layer being made from corrosion-resistant material,
   wherein the discontinuous metal layer comprises a first metal layer partly covered by the bridge layer, a second metal layer partly covering the bridge layer, and a first disconnected portion between the first metal layer and the second metal layer and partly filled with the bridge layer.

9. The TFT array substrate of claim 8, wherein the bridge layer is filled in the disconnected portion to electrically connect the discontinuous metal layer.

10. The TFT array substrate of claim 8, wherein the discontinuous metal layer is made from aluminum or molybdenum.

11. The TFT array substrate of claim 8, wherein the TFT array further comprises a plurality of pixel electrodes formed during the same photolithographic mask process as the bridge layer.

12. The TFT array substrate of claim 8, wherein the bridge layer is made from indium tin oxide, indium zinc oxide, high-melting point metal, or alloy.

13. A thin film transistor (TFT) array substrate, comprising:
   a substrate;
   a plurality of TFTs formed on the substrate; and
   a plurality of printed wirings connected to the TFTs, wherein at least one of the plurality of printed wirings comprises a discontinuous metal layer and a corrosion-resistant material layer connects to the discontinuous metal layer, wherein the discontinuous metal layer comprises a first metal layer partly covered by the bridge layer, a second metal layer partly covering the bridge layer, and a first disconnected portion between the first metal layer and the second metal layer and partly filled with corrosion-resistant material layer.

* * * * *